(12) United States Patent
Furumochi

(10) Patent No.: US 6,414,892 B2
(45) Date of Patent: Jul. 2, 2002

(54) SEMICONDUCTOR MEMORY DEVICE

(75) Inventor: Kazuto Furumochi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/817,201

(22) Filed: Mar. 27, 2001

(30) Foreign Application Priority Data

Aug. 7, 2000 (JP) ....................................... 2000-238528

(51) Int. Cl.[7] ................................................. G11C 7/02
(52) U.S. Cl. ..................... 365/210; 365/63; 365/230.06; 365/233
(58) Field of Search ............................. 365/230.06, 63, 365/210, 233

(56) References Cited

U.S. PATENT DOCUMENTS 5,841,720 A * 11/1998 Covino et al. .............. 365/210
6,088,279 A * 7/2000 Ishii ........................... 365/210
6,229,746 B1 * 5/2001 Tooher ....................... 365/210

* cited by examiner

Primary Examiner—Son T. Dinh
(74) Attorney, Agent, or Firm—Arent Fox Kintner Plotkin & Kahn

(57) ABSTRACT

A semiconductor memory device includes a row decoder selecting a row, word lines that extend from the row decoder and are connected to memory cells, a dummy word line that extends from starting ends of the word lines substantially in parallel therewith and returns to the starting ends in which the dummy word line is folded back in an intermediate position of a total length of the word lines, and a sense amplifier that amplifies data read from a memory cell coupled to a selected one of the word lines at a timing defined by a signal propagated along the dummy word line.

9 Claims, 8 Drawing Sheets

FIG. 4

SEMICONDUCTOR MEMORY DEVICE

BACKGROUND OF THE INVENTION

1. Field of the Invention

The present invention generally relates to semiconductor memory devices, and more particularly to a semiconductor memory device equipped with a timing control circuit that simulates a signal delay.

2. Description of the Related Art

It is required to finely control the operation timing of a semiconductor memory device to speed up the operation thereof. An attempt to realize a finer structure of the memory device by the fabrication process would result in an increased trend towards an unevenness of performance over the devices caused by a factor related to the fabrication process. It would be very difficult to perform fine timing control of the devices having dispersion in the performance.

For example, it is known to employ a delay circuit or a chopper circuit, which generates, from an external signal, a timing control signal that defines the operation timings of internal circuits of a semiconductor memory device. However, dispersion of the load capacitance or parasitic capacitance coupled to a wiring line would cause the timing control signal to deviate from the target timing. This requires the timing settings taken into consideration the deviation of the timing control signal. This prevents the speedup of the semiconductor memory device.

In order to overcome the above problem, Japanese Laid-Open Patent Application No. 11-203877 discloses the use of a circuit that simulates a signal delay caused in a route that has the greatest delay of time in terms of memory access. The simulation circuit is used to generate a timing control signal that defines the operation timings of the internal circuits. The timing control signal thus generated simulates the timings of the real memory access, so that unevenness of performance introduced during the fabrication process can be absorbed to some extent.

It is to be noted that the proposal disclosed in Japanese Laid-Open Patent Application No. 11-203877 employs the route that is furthest away from the input/output circuit of the memory device and is used to access the furthest memory cell from the row decoder. The following problems would arise from the use of the furthest route, as described below.

FIG. 1 is a view that explains an operation timing that takes place when the route that is furthest away from an input/output circuit and a row decoder is used for timing compensation.

A semiconductor memory device shown in FIG. 1 includes a clock generator part 10, a row decoder part 11, a sense amplifier/input-output circuit part 12, a timing control signal generating part 13, and a memory array part 14. FIG. 1 shows how the timing control is performed when data located close to the center illustrated by a dotted line AA' is read.

The clock generator part 10 generates, from an external clock supplied from the outside of the semiconductor memory device, an internal clock that controls internal operations of the device. A pulse signal based on the internal clock travels a distance Yc over a signal line along the row decoder part 11. Then, the pulse signal travels a distance Xc over a signal line as a word line activating signal of a row decoder in the row decoder part 11. An access to a memory cell located in an upper right position is simulated, and a pulse signal that simulates data travels distance Yc along a signal line that simulates a bit line, and arrives at the sense amplifier/input-output circuit part 12. Then, the pulse signal travels distance Xc along the signal line, and arrives at the timing control signal generating part 13. The part 13 generates, from the received pulse signal propagated along the above route, a timing control signal that controls the operation timings of a data output circuit in the sense amplifier/input-output circuit part 12. The timing control signal travels over a signal line of a length Xc/2, and is supplied to the data output circuit, which latches output data in response to the timing control signal. The data latched in the data output circuit is propagated along a signal route having a length Yio, and is output to the outside of the memory device.

Hence, the time it takes for the data output circuit to latch, in response to the timing signal, data that is located close to the center AA' and is propagated to the data output circuit can be expressed as follows:

$$Yc+Xc+Yc+Xc+(Xc/2).$$

By way of another example, data that is located in an upper portion of the central line of the memory array part 14 is read therefrom and is propagated to finally arrive at the data output circuit as follows. An address signal based on the timing of the internal clock travels distance Yc over the signal line along the row decoder part 11. Then, a corresponding row decoder of the row decoder part 11 is decoded into a word line activating signal, which travels distance Xc/2 along the word line. Thus, a memory cell located in an upper position on the central line of the memory array part 14 is accessed. A data signal from the memory cell travels distance Yc along the bit line, and arrives at the sense amplifier/input-output circuit part 12. Thus, the time of arrival from the initial timing can be expressed as follows:

$$Yc+(Xc/2)+Yc.$$

Thus, there is a difference of 2Xc between the timing when the data output circuit latches data in response to the timing control signal and the timing when the data arrives as the data output circuit.

When a memory cell located in an upper left position of the memory array part 14 is accessed, the data output circuit latches data in response to the timing control signal at a timing described below:

$$Yc+Xc+Yc+Xc$$

and the data arrives at the data output circuit at a timing described below:

$$Yc+Yc.$$

Thus, the difference between the latch timing and the arrival timing is also equal to 2Xc.

When a memory cell located in an upper right position of the memory array part 14 is accessed, the data output circuit latches data in response to the timing control signal at a timing described below:

$$Yc+Xc+Yc+Xc+Xc$$

and the data arrives at the data output circuit at a timing described below:

$$Yc+Xc+Yc.$$

Thus, the difference between the latch timing and the arrival timing is also equal to Xc.

It can be seen from the above that a needless wiring delay of 2Xc is constantly included when the timing compensation is performed using the route shown in FIG. 1. However, the wiring delay of 2Xc is too much to speed up the circuit operation.

With the above in mind, it would be conceivable to employ a route shown in FIG. 2 to perform timing compensation. The timing control signal generating part 13 is provided at the right side of the sense amplifier/input-output circuit part 12 with regard to the route shown in FIG. 2.

When a memory cell located in an upper position on the central line of the memory array part 14 is accessed, the data output circuit latches data in response to the timing control signal at a timing described below:

$$Yc+Xc+Yc+Xc/2$$

and the data arrives at the data output circuit at a timing described below:

$$Yc+Xc/2+Yc.$$

Thus, the difference between the latch timing and the arrival timing is also equal to 2Xc.

When a memory cell located in an upper left position of the memory array part 14 is accessed, the data output circuit latches data in response to the timing control signal at a timing described below:

$$Yc+Xc+Yc+Xc$$

and the data arrives at the data output circuit at a timing described below:

$$Yc+Yc.$$

Thus, the difference between the latch timing and the arrival timing is also equal to 2Xc.

When a memory cell located in an upper right position of the memory array part 14 is accessed, the data output circuit latches data in response to the timing control signal at a timing described below:

$$Yc+Xc+Yc$$

and the data arrives at the data output circuit at a timing described below:

$$Yc+Xc+Yc.$$

Thus, the difference between the latch timing and the arrival timing is zero.

As described above, the timing compensation with the route shown in FIG. 2 results in a maximum wiring delay of 2Xc and a minimum wiring delay of zero. Thus, the above method would not cope with an error of the delay time caused by a factor involved in the fabrication process at all. Hence, it is necessary to ensure a somewhat margin taking the delay time equal to zero into consideration. This requires a delay of time equal to or longer than 2Xc when the maximum delay time is considered. Therefore, it is not expected that the circuit operates at a high speed and in a stable fashion because the margin is not much for the wiring delay of zero.

SUMMARY OF THE INVENTION

It is a general object of the present invention to provide a semiconductor memory device in which the above disadvantages are eliminated.

A more specific object of the present invention is to provide a semiconductor memory device capable of operating at a high speed and in a stable fashion regardless of unevenness of performance over devices introduced during the fabrication process.

The above objects of the present invention are achieved by a semiconductor memory device comprising: a row decoder selecting a row; word lines that extend from the row decoder and are connected to memory cells; a dummy word line that extends from starting ends of the word lines substantially in parallel therewith and returns to the starting ends in which the dummy word line is folded back in a predetermined position of a total length of the word lines; and a sense amplifier that amplifies data read from a memory cell coupled to a selected one of the word lines at a timing defined by a signal propagated along the dummy word line.

The above objects of the present invention are also achieved by a semiconductor memory device comprising: a timing control signal generating circuit that simulates a data access route to a memory cell and thus generates a timing control signal; and a dummy word line that extends substantially in parallel with word lines and returns to starting ends of the word lines in a predetermined position of a total length of the word lines, the timing control signal generating circuit generating a timing control signal based on a signal propagated along the dummy word line.

BRIEF DESCRIPTION OF THE DRAWINGS

Other objects, features and advantages of the present invention will become more apparent from the following detailed description when read in conjunction with the accompanying drawings, in which:

FIG. 4 is a circuit diagram of a configuration of a sense amplifier/input-output circuit part and a memory array part shown in FIG. 3;

DESCRIPTION OF THE PREFERRED EMBODIMENTS

Figure 1:
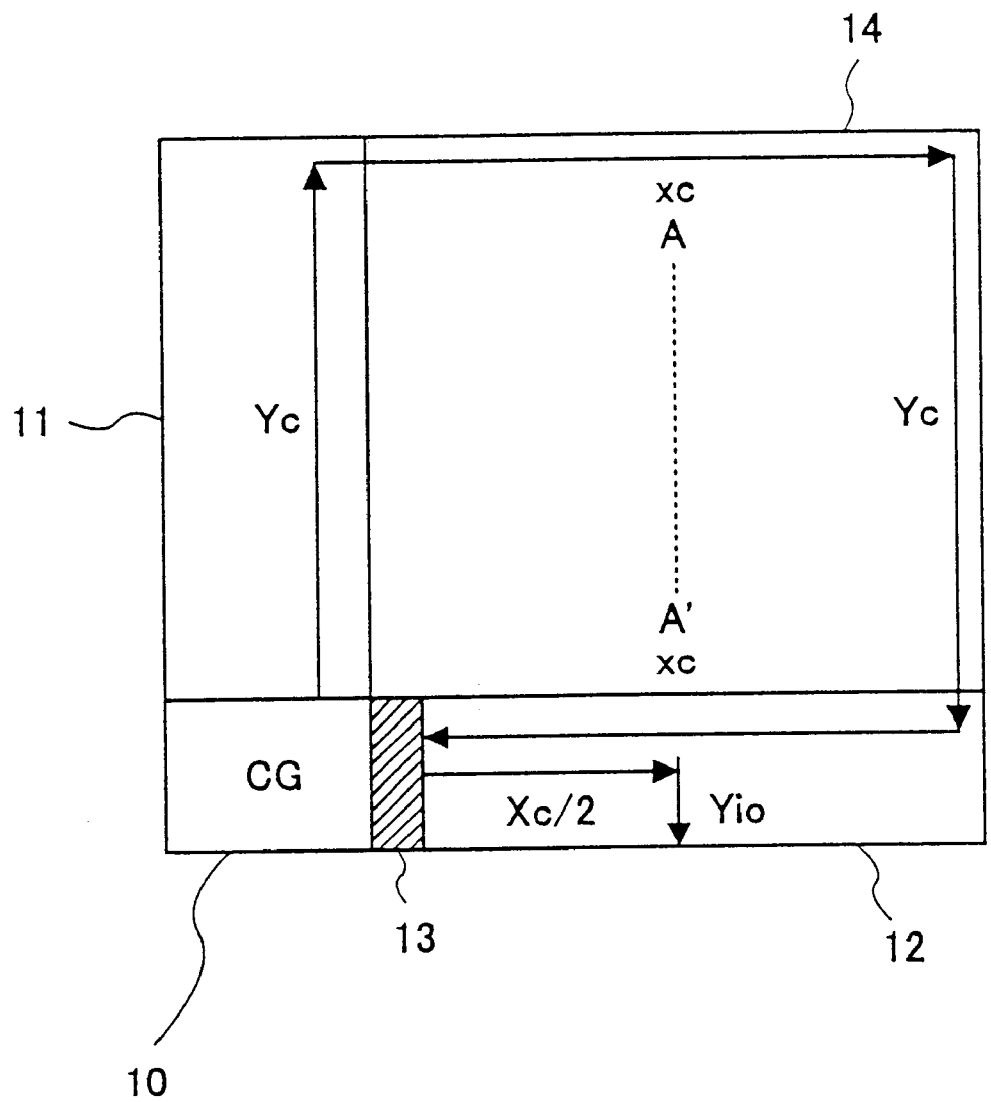
FIG. 1 is a view that explains an operation timing that takes place when a route that is furthest away from an input/output circuit and a row decoder is used for timing compensation.
Figure 2:
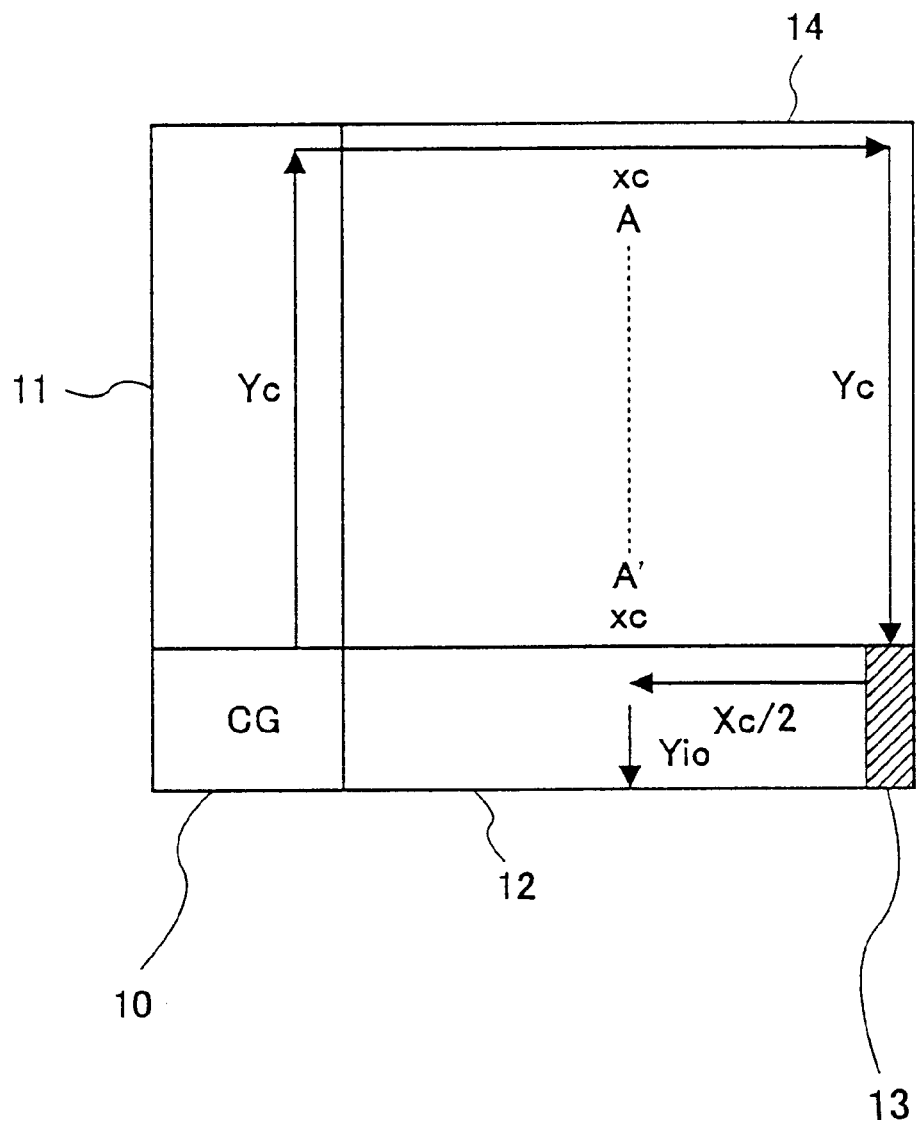
FIG. 2 is a view that explains an operation timing that takes place when a timing control signal generating part is provided at the right side of a sense amplifier/input-output circuit part.
Figure 3:
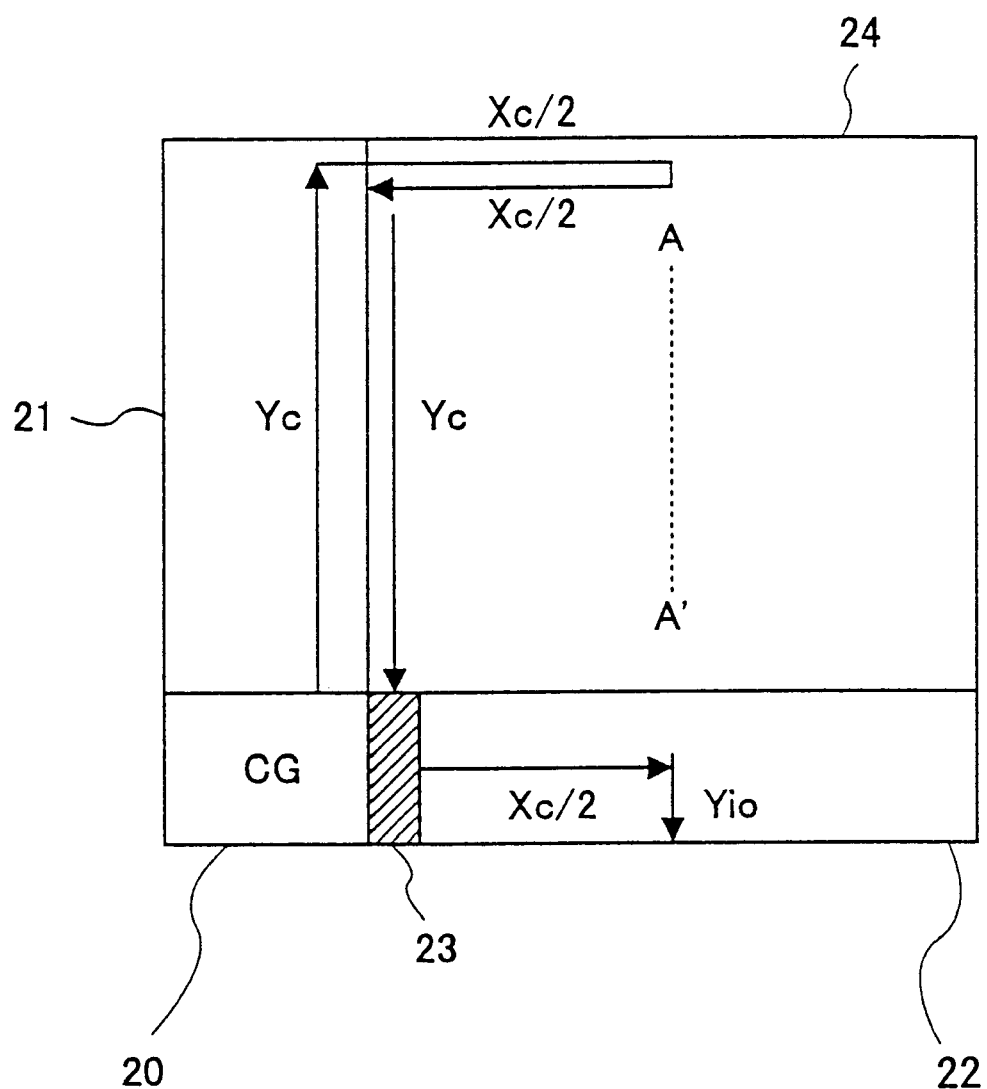
FIG. 3 is a diagram of a configuration for generating a timing control signal for timing compensation in accordance with the principle of the present invention.

FIG. 3 is a diagram of a configuration for generating a timing control signal for timing compensation in accordance with the principle of the present invention.

A semiconductor memory device shown in FIG. 3 includes a clock generator part 20, a row decoder part 21, a sense amplifier/input-output circuit part 22, a timing control signal generating part 23, and a memory array part 24. As shown in FIG. 3, a signal route that simulates a signal delay on a word line in the memory array part 24 is folded back in an intermediate position thereof in the memory array part 24. A timing compensation circuit that simulates reading of data from a memory cell and a signal route that simulates a bit line are arranged close to the row decoder part 21. The timing control signal generating circuit 23 is provided immediately below the signal route that simulates the bit line.

In FIG. 3, the word line in the timing compensation circuit is folded back in a substantial center of the memory array part 24.

The clock generator part 20 generates, from an external clock supplied from the outside of the semiconductor memory device, an internal clock that controls an internal operation of the memory device. A pulse signal based on the internal clock travels distance Yc over a signal line along the row decoder 21. Then, the pulse travels a distance approximately equal to Xc/2 over a signal line that simulates a word line as a word line activating signal of a row decoder in the row decoder part 21. Then, the pulse signal is folded back in the central position of the memory array part 24, and further travels a distance approximately equal to Xc/2. In other words, the pulse signal is folded back in the halfway position Xc/2 of the total length Xc of the signal line. Then, an operation of access to a memory cell located in a upper left position of the memory array part 24 is simulated, and a pulse signal that simulates data travels a distance of Yc along a signal line that simulates a bit line and is adjacent to the row decoder part 21. Then, the pulse signal arrives at the timing control signal generating part 23. The part 23 generates a timing control signal that controls the timings of a data output circuit in the sense amplifier/input-output circuit part 22 from the pulse signal propagated along the above route.

When data located in a position close to the center of the memory array part 24 illustrated by the dotted line AA' is read, the timing control signal travels along the signal line of the length Xc/2 and is supplied to the data output circuit. In response to the latched timing control signal, the data output circuit latches output data. The data latched in the data output circuit travels a signal route of a length Yio, and is then output to the outside of the semiconductor memory device. In this case, the data output circuit latches data in response to the timing control signal at the following timing initiated from the first timing:

Yc+Xc/2+Xc/2+Yc+Xc/2.

In contrast, when data is read from a memory cell located in an upper portion on the central line of the memory cell array 24, data arrives at the data output circuit as follows. An address signal based on the timing of the internal clock travels distance Yc over the signal line along the row decoder 21. The address signal is decoded by a corresponding row decoder in the row decoder part 21. Then, the word line activating signal travels distance Xc/2 along the activated word line, so that a memory cell located in the upper portion on the central line of the memory array part 24 can be accessed. A data signal from the accessed memory cell travels distance Yc along the bit line, and arrives at the sense amplifier/input-output circuit part 22. Thus, the arrival time from the first timing can be expressed as follows:

Yc+Xc/2+Yc.

Hence, the difference between the latch timing and the arrival timing is equal to Xc.

When data located in an upper left position of the memory array part 24 is accessed, the data output circuit latches data in response to the timing control signal at a timing described below:

Yc+Xc/2+Xc/2+Yc and the data arrives at the data output circuit at a timing described below:

Yc+Yc.

Thus, the difference between the latch timing and the arrival timing is also equal to Xc.

When a memory cell located in an upper right position of the memory array part 24 is accessed, the data output circuit latches data in response to the timing control signal at a timing described below:

Yc+Xc/2+Xc/2+Yc+Xc and the data arrives at the data output circuit at a timing described below:

Yc+Xc+Yc.

Thus, the difference between the latch timing and the arrival timing is also equal to Xc.

As described above, when the timing compensation is performed using the route shown in FIG. 3, Xc is always included as the constant wiring delay. Hence, the constant signal delay can be achieved regardless of the memory access position and is shorter than that of the conventional art. The semiconductor memory devices thus formed are immune to unevenness of performance introduced during the fabrication process and are capable of operating at a relatively high speed.

The signal line that simulates the word like is folded back in the position of approximately Xc/2 (half the width of the memory array part 24). However, the folding back position is not limited to the central position of the memory array part 24. For example, the signal line that simulates the word line may be folded back at the position equal to Xc/3. This alternative results in a slightly short wiring delay, which may make the device less stable than the device equipped with Xc/2. However, the operation for Xc/3 is faster than that for Xc/2. It is also possible to fold back the signal line that simulates the word line in a position of 2Xc/3. In this case, the operation is slower than but more stable than that for Xc/2.

A description will now be given of a first embodiment of the present invention.

Figure 4:
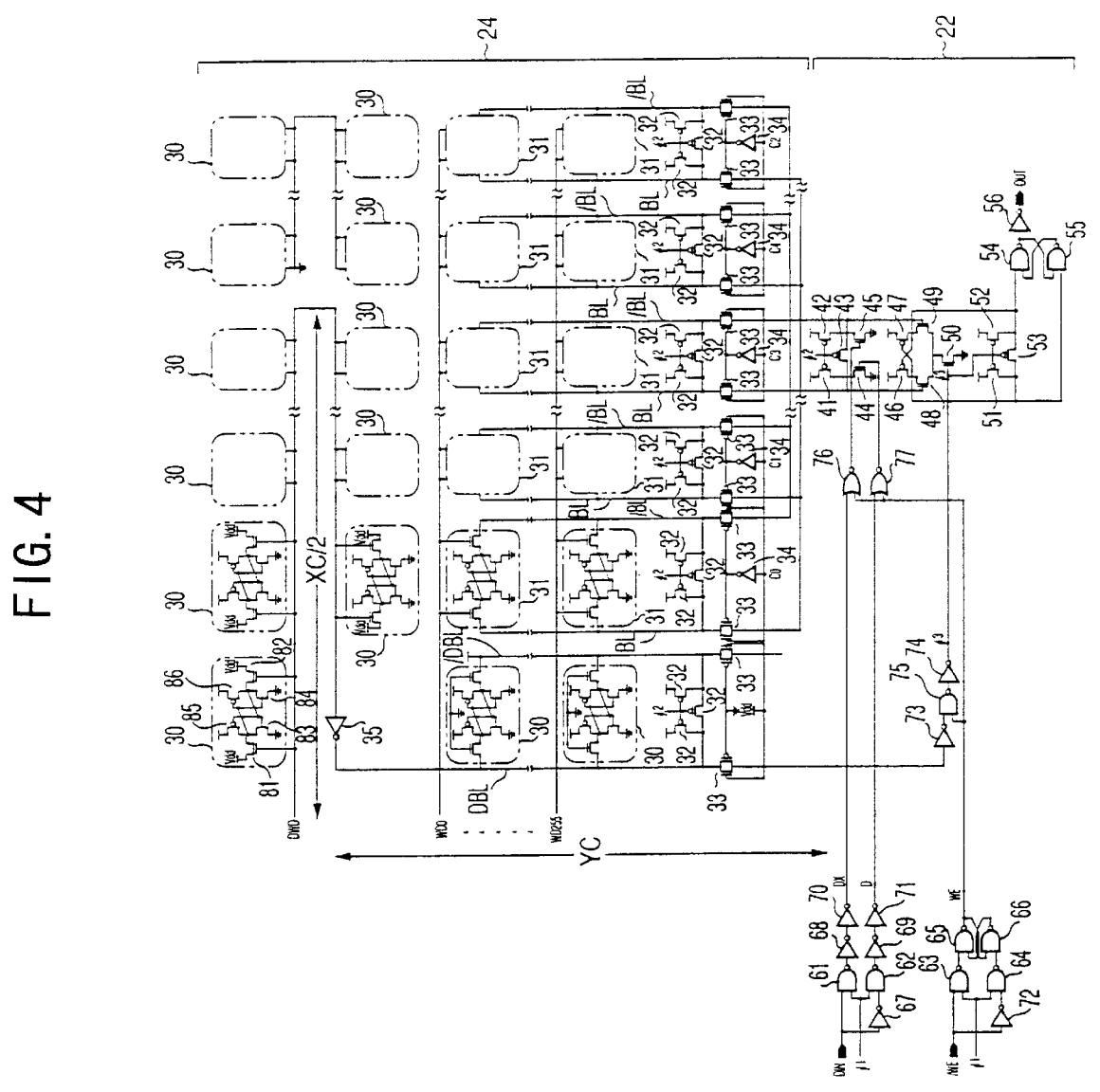

FIG. 4 is a circuit diagram of a circuit configuration of the sense amplifier/input-output circuit part 23 and the memory array part 24.

The memory array part 24 includes a plurality of dummy cells 30 and a plurality of memory cells 31. The dummy cells and the memory cells 31 have an identical circuit configuration, which includes NMOS (N-channel Metal Oxide Semiconductor) transistors 81 through 84, and PMOS (P-channel MOS) transistors 85 and 86. Further, the memory array part 24 includes a plurality of PMOS transistors 32, a plurality of transfer gates 33, a plurality of inverters 34, and an inverter 35. The PMOS transistors 32 precharge and equalize bit lines BL and /BL or dummy bit lines DBL and /DBL. The transfer gates 33 is opened or closed in accordance with column select signals C0 through C7. The inverters 34 drive the transfer gates. The inverter 35 simulates memory data. Word lines WD0 through WD255 are connected to the memory cells 31, and the dummy word line DWD is connected to the dummy memory cells 30.

When the dummy word line DWD is activated, the activated signal turns ON the NMOS transistors 81 and 82 of the dummy memory cells 30, and travels along the wiring length Xc/2. Then, the activated signal is folded back and travels along the wiring length Xc/2 to arrive at the inverter 35. The output signal of the inverter 35 is a signal that simulates data of memory cell, and is propagated along the dummy bit line DBL. As shown in FIG. 4, the dummy memory cells 30 are connected to the dummy bit line DBL as in the case of the regular bit line to which the memory cells 31 are connected. A data simulation signal travels along the wiring length Yc of the dummy bit line DBL, and is then supplied to the sense amplifier/input-output circuit part 22.

The sense amplifier/input-output circuit part 22 includes PMOS transistors 41 through 43 for precharging and equalizing, and NMOS transistors 44 and 45 for transferring input data to the bit lines. The input data is externally supplied via a terminal DIN, and is supplied to the gates of the NMOS transistors 44 and 45 of the NMOS transistors 44 and 45 via NAND circuits 61 and 62, inverters 67 through 71, and NOR circuits 76 and 77.

The sense amplifier/input-output circuit part 22 includes a sense amplifier made up of PMOS transistors 46 and 47 and NMOS transistors 48 through 50. A write enable signal IWE supplied from the outside of the device is supplied to the gate of the NMOS transistor 50 of the sense amplifier via an inverter 72, NAND circuits 63 through 66, a NAND circuit 75, and an inverter 74. The other input of the NAND circuit 75 is supplied with a dummy data signal via the dummy bit line DBL and an inverter 73. The dummy data signal defines the drive initiating timing of the sense amplifier. A circuit part made up of the inverters 73 and 74 and the NAND circuit 75 corresponds to the timing control signal generating part 23 shown in FIG. 3.

Further, the sense amplifier/input-output circuit part 22 includes PMOS transistors 51 through 53 for equalizing an output data line, and includes NAND circuits 54 and 55 and an inverter 56 that serve as a data output buffer.

When one of the word lines WD0 through WD255 is selected, data is read out from the corresponding memory cell 31, and is supplied to the sense amplifier of the sense amplifier/input-output circuit part 22. In parallel with the above data read operation, the dummy word line DWD is activated, and the dummy data signal is propagated along the dummy bit line DBL and is supplied to the gates of the transistors that drive the sense amplifier of the sense amplifier/input-output circuit part 22. Thus, the driving of the sense amplifier is initiated in response to the timing of the dummy data signal, so that data is sensed and latched at an appropriate timing.

In short, the semiconductor memory device shown in FIG. 3 includes: a row decoder (21) selecting a row; word lines (WD0-WD255) that extend from the row decoder and are connected to memory cells; a dummy word line (DWD) that extends from starting ends of the word lines in parallel therewith and returns to the starting ends in which the dummy word line is folded back in an intermediate position (for example, Xc/2) of a total length (Xc); and a sense amplifier (22) that amplifies data read from a memory cell coupled to a selected one of the word lines at a timing defined by a signal propagated along the dummy word line.

Figure 5:
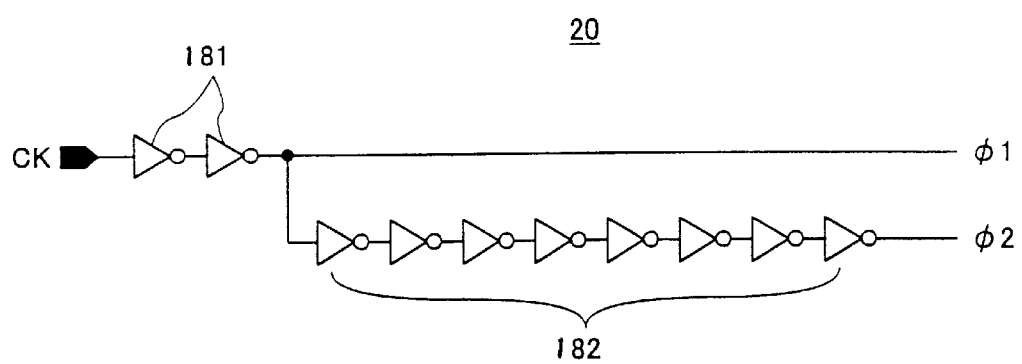
FIG. 5 is a circuit diagram of a configuration of a clock generator part shown in FIG. 3.

FIG. 5 is a circuit diagram of a configuration of the clock generator part 20.

The clock generator part 20 shown in FIG. 20 includes a plurality of inverters 181 and a plurality of inverters 182. A clock CK supplied from the outside of the device is delayed by the inverters 181, and is supplied to other circuits as a clock $\Phi 1$ for synchronization control. The clock signal $\Phi 1$ is further delayed by the inverters 182, and is supplied to other circuits as a clock $\Phi 2$ for synchronization control.

For example, the clock $\Phi 2$ is supplied to the gate of the PMOS transistor 32 shown in FIG. 4, and defines the timing for precharging and equalizing the bit lines. The clock $\Phi 1$ is supplied to the NAND circuits 61 and 62 of the data input part shown in FIG. 4, and controls the data input timing. The clock $\Phi 1$ is also supplied to the NAND gates 63 and 64 of the write enable signal input part, and controls the input timing of the write enable signal.

Figure 6:
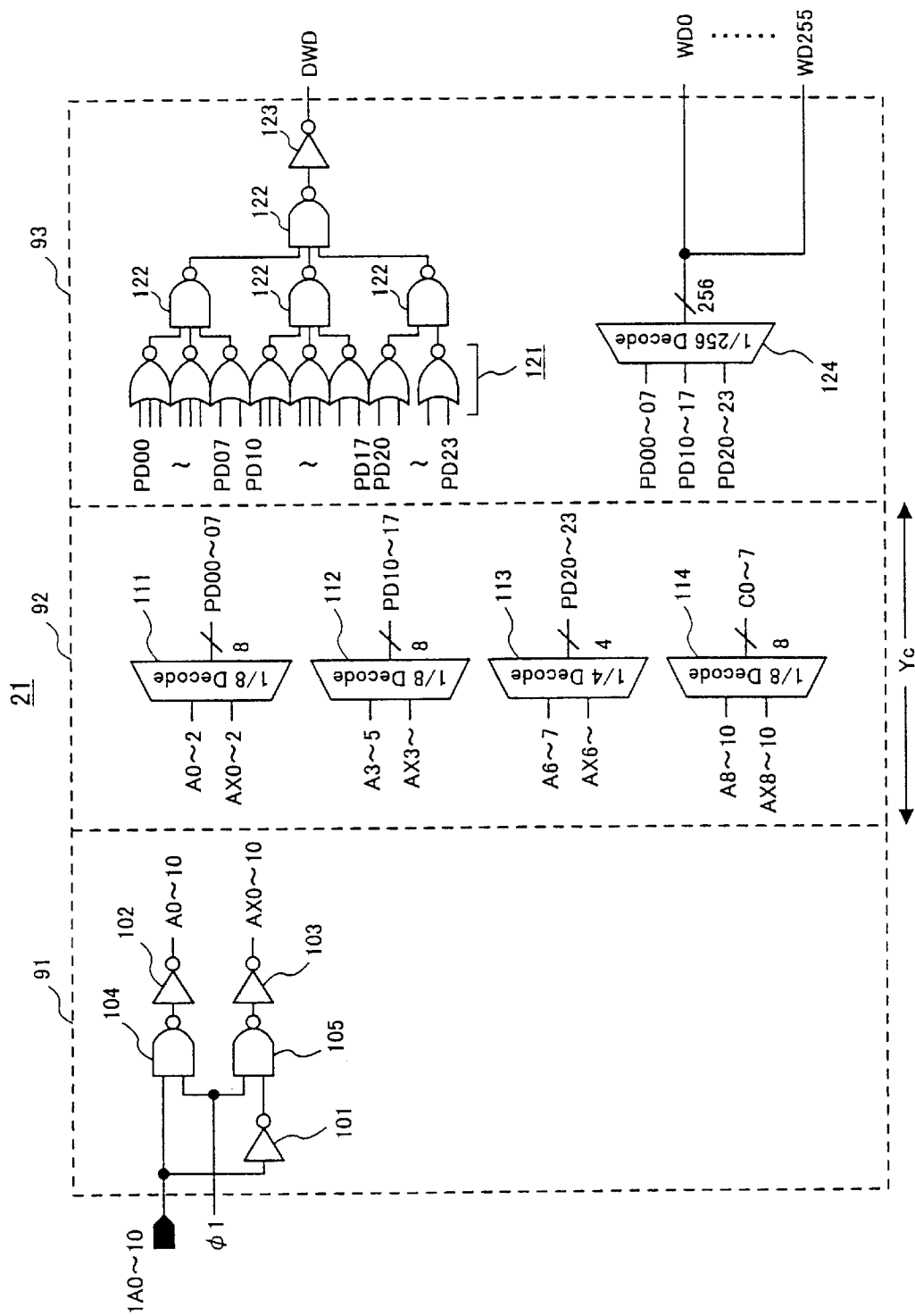
FIG. 6 is a circuit diagram of a configuration of a row decoder part shown in FIG. 3.

FIG. 6 is a circuit diagram of a configuration of the row decoder part 21.

Referring to FIG. 6, the row decoder part 21 includes an address input part 91, an address predecode part 92, and an address decode part 93.

The address input part 91 is a circuit which latches address signals IA0 through IA10 externally applied to address input terminals in synchronism with the clock $\Phi 1$. The address input part 91 includes inverters 101 through 103, and NAND circuits 104 and 105. The output of the inverter 102 is composed of address signals A0 through A10, which are supplied to the address predecode part 92. The output of the inverter 103 is composed of inverted address signals AX0 through AX10, which are supplied to the address predecode part 92.

The address predecode part 92 includes decoders 111 through 114. The decoder 111 receives address signals A0 through A2 and inverted address signals AX0 through AX2, and decodes a three-bit address into predecode signals PD0 through PD7. Similarly, the decoders 112 and 113 decode the respective addresses into predecode signals PD10 through PD17 and predecoded signals PD20 through PD23. The decoder 114 receives address signals A8 through A10 and inverted address signals AX8 through AX10. Then, the decoder 114 decodes a three-bit address into column select signals C0 through C7, which are supplied to the memory array part 24. The predecoded signals are supplied to the address decode part 93.

The address decode part 93 includes a plurality of NOR circuits 121, a plurality of NAND circuits 122, an inverter 123, and a decoder 124. The decoder 124 decodes the predecoded signals from the address predecode part 92 into word line activating signals, which are then supplied to the word lines WD0 through WD255 shown in FIG. 4. The NOR circuits 121, the NAND circuits 122 and the inverter 123 form a dummy row decoder that generates a dummy word line activating signal. The dummy row decoder receives the predecoded signals and generates the dummy word line activating signal regardless of the specified address. The dummy word line activating signal is supplied to the dummy word line DWD shown in FIG. 4.

Referring to FIG. 6, the signal line of the wiring length Yc in the row decoder part 21 may be considered as a signal route extending from the outputting of the address signal and the inverted address signal from the address input part 91 to the inputting of the predecoded signals to the address decode part 93.

According to the embodiment of the present invention shown in FIGS. 4 through 6, the constant signal delay can be achieved regardless of the memory access position, and the signal delay can be reduced as compared with the conventional art. This makes it possible to produce semiconductor memory devices capable of operating at a high speed in a stable fashion regardless of unevenness in performance introduced during the production process.

Figure 7:
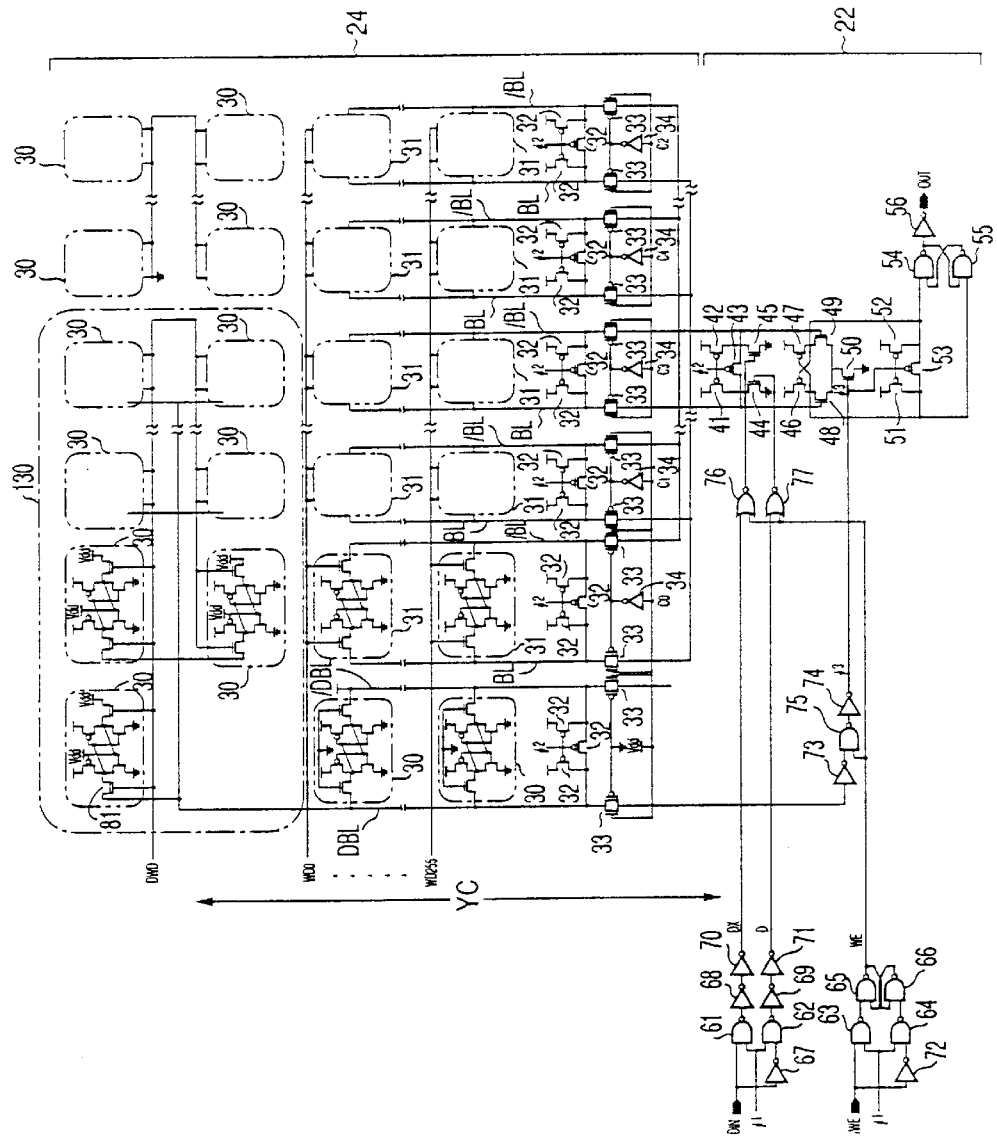
FIG. 7 is a circuit diagram of a configuration of a sense amplifier/input-output circuit part used in a second embodiment of the present invention.

FIG. 7 is a circuit diagram of a configuration of the sense amplifier/input-output circuit part 22 and the memory array part 24 according to a second embodiment of the present invention. In FIG. 7, parts that are the same as those shown in FIG. 4 are given the same reference numbers.

The second embodiment employs a dummy memory cell part 130, which differs from the corresponding circuit used in the first embodiment shown in FIG. 4. In the second embodiment, data are read from dummy memory cells 30 in parallel to the dummy word line DWD, and are transferred over the dummy bit line DBL.

In the configuration illustrated in FIG. 4, the dummy word line DWD is connected to the gate of the NMOS transistors 81 of the dummy memory cells 30. However, in practice data are not really read from the dummy memory cells 30, but the signal of the dummy word line DWD is inverted into the dummy data signal by the inverter 35. This is because data read from the dummy memory cells 30 are extremely fine at the commencement of the data read operation, and are not appropriate to the dummy data signal.

In the second embodiment, the dummy word line DWD is connected to the gates of the NMOS transistors 81 of the dummy memory cells 30. Data in the dummy memory cells 30 are really read as a dummy data signal, which is supplied to the dummy bit line DBL. In the regular memory cells 31, data is read out to the bit line from only one memory cell. In contrast, data are read from the plurality of dummy cells 30 in parallel and are supplied to the dummy bit line DBL. This makes it possible to obtain a sufficient signal level even at the commencement of the data read operation and to achieve sure timing compensation. Also, as compared to the first embodiment in which the data read operation is simulated by the inverter 35, the second embodiment simulates the same operation mechanism as that of the real data read operation. This makes it possible to achieve more precise timing compensation.

Figure 8:
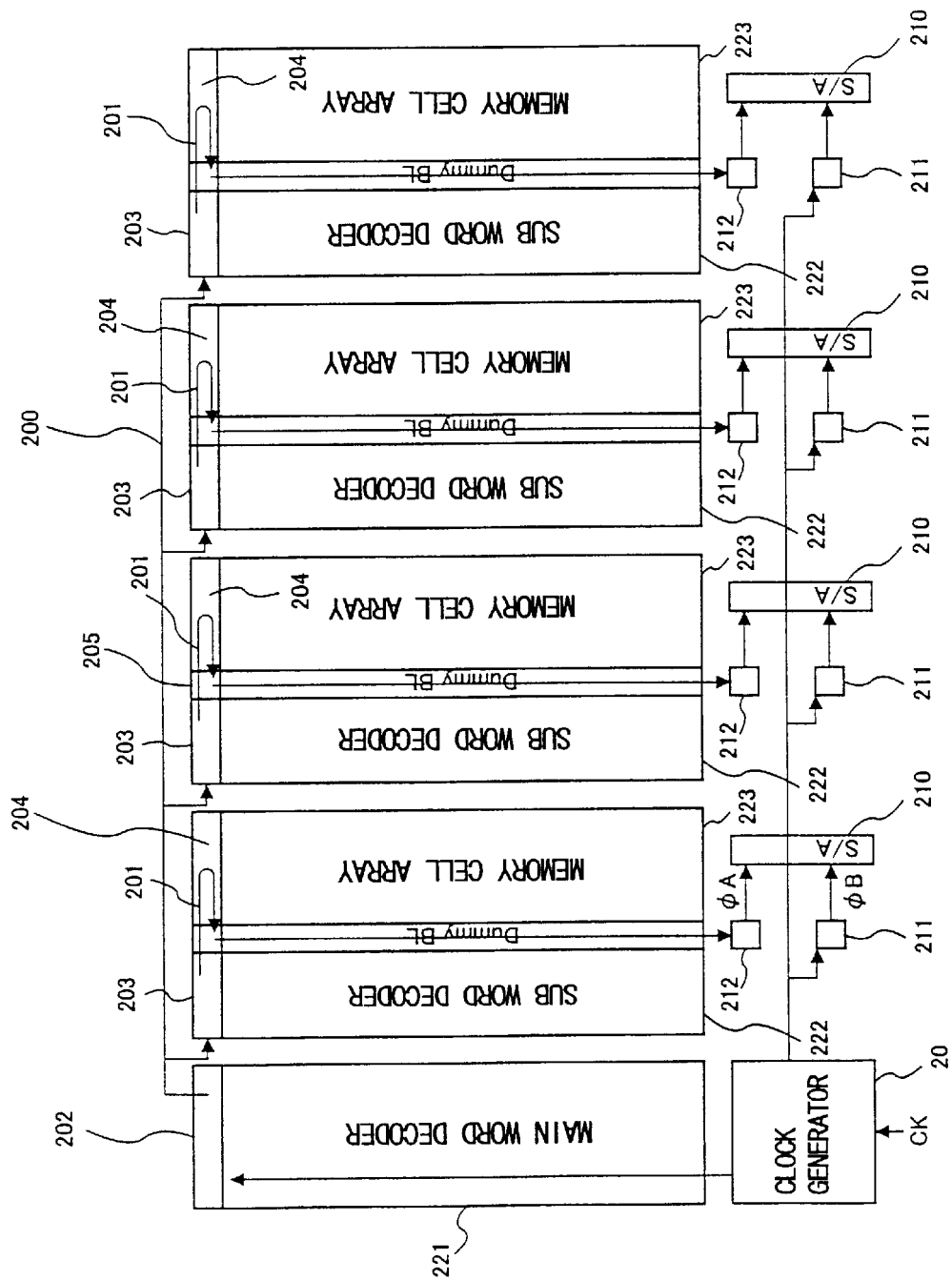
FIG. 8 is a block diagram of a configuration according to a third embodiment of the present invention.

FIG. 8 is a block diagram of a configuration of a third embodiment of the present invention.

The third embodiment is characterized by employing a hierarchical word structure. Referring to FIG. 8, the semiconductor memory device includes a word decoder, which is made up of a main word decoder 221, and a plurality of sub word decoders 222. A dummy main word decoder 202 is provided in correspondence with the main word decoder 221, and a dummy sub word decoder 203 is provided in correspondence with the sub word decoders 222. A dummy memory cell part 204 is provided in such a way as to be adjacent to a memory cell array part 223.

The clock generator part 20 generates an internal clock that controls the internal operation of the semiconductor memory device from the external clock CK. A pulse signal based on the internal clock travels over a signal ling along the main word decoder 221. Then, the pulse signal is propagated along a dummy main word line 200 as a word line activating signal by the dummy main word decoder 202, and is supplied to the dummy sub word decoders 203. The pulse signals are propagated along the dummy sub word lines 201 as sub word line activating signals by the dummy sub word decoders 203, and are folded back in the central position of the memory cell array 223 (the central position of the dummy memory cell 204). Then, the pulse signals are supplied to a drive cell 205. This drive cell 205 corresponds to a circuit element corresponding to the inverter 35 shown in FIG. 4, and supplies a dummy data signal to the dummy bit line in response to the signals for activating the dummy sub word lines 201. The dummy data signals are propagated along the dummy bit lines and arrive at the timing control signal generating part 212. The part 212 generates, from the dummy data signal propagated along the above-mentioned route, a timing control signal $\Phi A$ for controlling the data latch timing of a sense amplifier 210. A clock circuit 211 generates a timing control signal $\Phi B$ for controlling the timings of other parts from the internal clock that is output by the clock generator part 20.

As described above, according to the third embodiment of the present invention directed to the hierarchical structure in which the main word lines and the sub word lines are hierarchically arranged, the dummy sub word lines that correspond to the real sub word lines are folded back in an intermediate position in the memory array part, and the dummy data signals are propagated through the dummy word lines respectively arranged close to the sub word decoders. Thus, it is possible to achieve the constant signal delay regardless of the memory access position and reduce the signal delay time, as compared to the conventional art. Thus, semiconductor memory devices of the present invention are less affected by unevenness of performance introduced during the fabrication process and are capable of operating at a relatively high speed.

The present invention is not limited to the specifically disclosed embodiments, and variations and modifications may be made without depart from the scope of the present invention.

The present application is based on Japanese Priority Application No. 2000-238528 filed on Aug. 7, 2000, the entire contents of which are hereby incorporated by reference.

What is claimed is:

1. A semiconductor memory device comprising:

a row decoder selecting a row;

word lines that extend from the row decoder and are connected to memory cells;

a dummy word line that extends from starting ends of the word lines substantially in parallel therewith and returns to the starting ends in which the dummy word line is folded back in a predetermined position of a total length of the word lines;

a sense amplifier that amplifies data read from a memory cell coupled to a selected one of the word lines at a timing defined by a signal propagated along the dummy word line;

bit lines that supply the sense amplifier with the data read from the memory cell coupled to said selected one of the word lines;

a timing control signal generating part generating a timing control signal that controls a drive timing of the sense amplifier; and a dummy bit line that has a length approximately equal to a total length of the bit lines and extend approximately in parallel with the bit lines, the dummy bit line being connected to the timing control signal, dummy data obtained from the signal propagated along the dummy word line being supplied to the timing control signal generating part, which generates the timing control signal based on the dummy data.

2. The semiconductor memory device as claimed in claim 1, wherein said row decoder includes a dummy row decoder that drives the dummy word line, the dummy row decoder being located in a furthest position away from an address input terminal of the semiconductor memory device.

3. The semiconductor memory device as claimed in claim 2, wherein an input signal applied to the dummy row decoder is identical to a select signal that the row decoder uses to drive said selected one of the word lines.

4. The semiconductor memory device as claimed in claim 1, further comprising dummy memory cells connected to the dummy word line, wherein dummy data read out from the dummy memory cells in response to the signal propagated along the dummy word line are supplied to the dummy bit line in parallel.

5. The semiconductor memory device as claimed in claim 1, further comprising an inverter that receives the signal propagated along the dummy word line, an output of the inverter being supplied to the dummy bit line as said dummy data.

6. The semiconductor memory device as claimed in claim 1, wherein the predetermined position is an intermediate position of the total length of the word lines.

7. A semiconductor memory device comprising:

a timing control signal generating circuit that simulates a data access route to a memory cell and thus generates a timing control signal; and a dummy word line that extends substantially in parallel with word lines and returns to starting ends of the word lines in a predetermined position of a total length of the word lines, the timing control signal generating circuit generating a timing control signal based on a a signal propagated along the dummy word line.

8. The semiconductor memory device as claimed in claim 7, further comprising an input/output circuit that amplifies data read from a memory cell at a timing based on the timing control signal.

9. The semiconductor memory device as claimed in claim 7, wherein the predetermined position is an intermediate position of the total length of the word lines.

\* \* \* \* \*